United States Patent
Masias et al.

(10) Patent No.: US 10,164,450 B2
(45) Date of Patent: Dec. 25, 2018

(54) EARLY ALERT OF BATTERY THERMAL STATE BASED ON VOLTAGE

(71) Applicant: FORD GLOBAL TECHNOLOGIES, LLC, Dearborn, MI (US)

(72) Inventors: Alvaro Masias, Ann Arbor, MI (US); Kent Snyder, Dearborn, MI (US); Theodore James Miller, Milan, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 427 days.

(21) Appl. No.: 14/827,813

(22) Filed: Aug. 17, 2015

(65) Prior Publication Data
US 2017/0054311 A1     Feb. 23, 2017

(51) Int. Cl.
| | |
|---|---|
| *B60L 11/18* | (2006.01) |
| *G01R 31/36* | (2006.01) |
| *H01M 10/46* | (2006.01) |
| *H02J 7/00* | (2006.01) |

(52) U.S. Cl.
CPC .......... *H02J 7/0031* (2013.01); *B60L 11/182* (2013.01); *B60L 11/187* (2013.01); *B60L 11/1816* (2013.01); *B60L 11/1861* (2013.01); *G01R 31/362* (2013.01); *G01R 31/3675* (2013.01); *H02J 7/007* (2013.01)

(58) Field of Classification Search
CPC .................. B60L 11/1861; B60L 11/187
USPC ....................................... 320/109, 134, 136
See application file for complete search history.

(56) References Cited

U.S. PATENT DOCUMENTS

| | | | | |
|---|---|---|---|---|
| 4,418,310 A | * | 11/1983 | Bollinger .............. | H02J 7/0081 320/149 |
| 4,503,378 A | * | 3/1985 | Jones .................... | H02J 7/0081 320/161 |
| 4,806,840 A | * | 2/1989 | Alexander ........... | H01M 10/44 320/149 |
| 5,057,762 A | * | 10/1991 | Goedken .............. | H02J 7/0008 320/116 |
| 5,122,722 A | * | 6/1992 | Goedken .............. | H02J 7/0024 320/116 |
| 5,365,160 A | * | 11/1994 | Leppo ................... | H02J 7/0024 320/160 |
| 5,541,496 A | * | 7/1996 | Simmonds ............ | H02J 7/0091 320/151 |
| 5,563,494 A | * | 10/1996 | Cuesta .................. | H02J 7/0091 320/106 |

(Continued)

*Primary Examiner* — David V Henze-Gongola
*Assistant Examiner* — Tarikh Kanem Rankine
(74) *Attorney, Agent, or Firm* — David Kelley; Brooks Kushman P.C.

(57) ABSTRACT

A battery management controller includes input channels to receive a voltage signal from a battery and output channels to provide diagnostic signals to an operator. The controller is programmed to output a diagnostic signal predictive of a thermal condition in response to the voltage decreasing at a rate greater than a predetermined rate that signals that the voltage is decreasing toward a local minimum that precedes an increase in the voltage indicative of a battery temperature increase rate becoming greater than a threshold. The diagnostic signal may be used to alert the operator of the condition. The controller may be further programmed to issue commands to mitigate the thermal condition based on the diagnostic signal.

18 Claims, 3 Drawing Sheets

(56) References Cited

U.S. PATENT DOCUMENTS

| | | | |
|---|---|---|---|
| 5,608,325 A * | 3/1997 | Chabbert | G01R 31/3613 320/132 |
| 5,612,607 A * | 3/1997 | Nicolai | H02J 7/0081 320/148 |
| 5,670,863 A * | 9/1997 | Broell | H02J 7/0073 320/145 |
| 5,818,202 A * | 10/1998 | Miyamoto | H01M 10/44 320/125 |
| 6,008,628 A * | 12/1999 | Brotto | H02J 7/0091 320/137 |
| 6,294,897 B1 | 9/2001 | Champlin | |
| 6,771,049 B2 | 8/2004 | Kawagoe et al. | |
| 6,788,069 B2 | 9/2004 | Vacher | |
| 8,952,823 B2 | 2/2015 | Xie et al. | |
| 2015/0042271 A1* | 2/2015 | Nakagawa | H02J 7/025 320/108 |
| 2015/0244192 A1* | 8/2015 | Dauchy | H02J 7/0086 320/152 |

\* cited by examiner

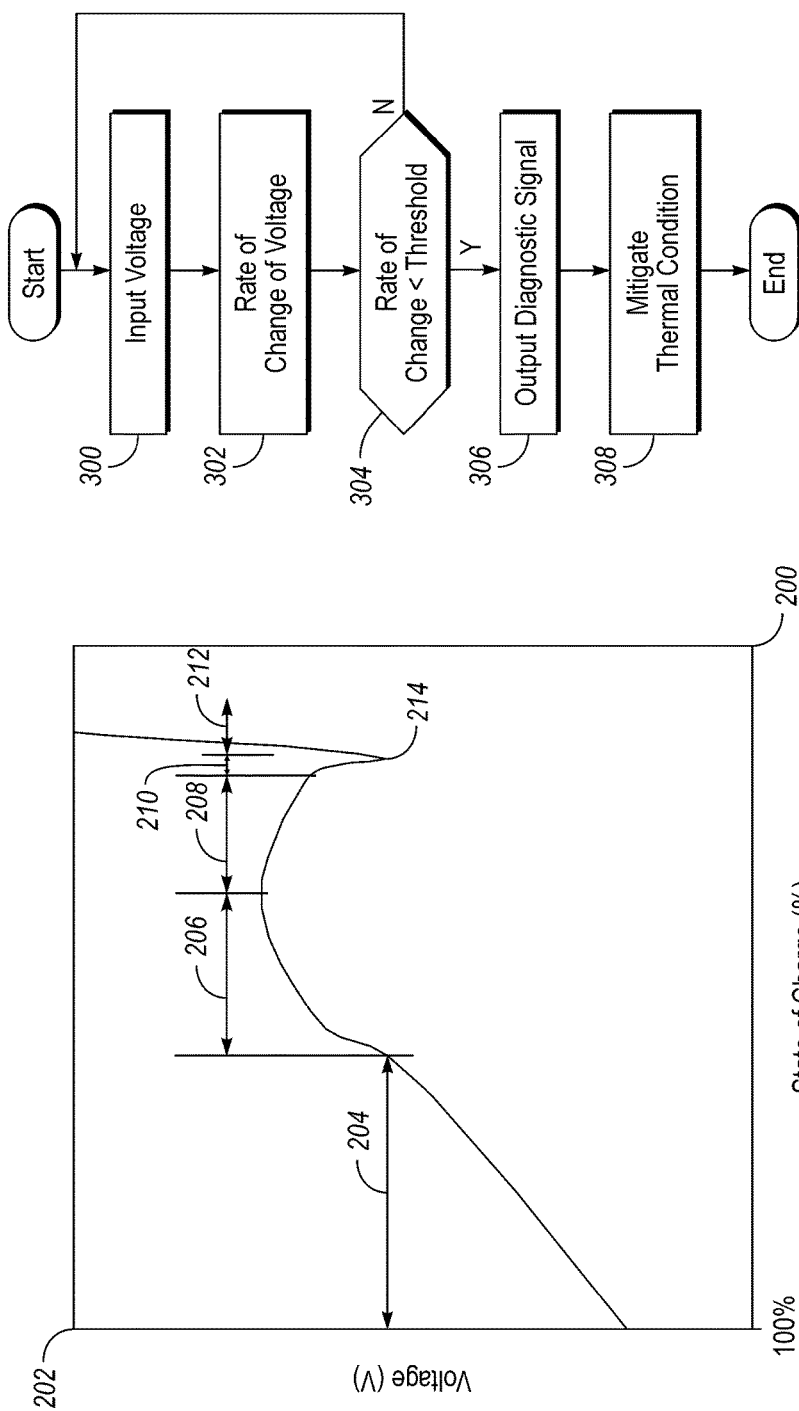

# US 10,164,450 B2

EARLY ALERT OF BATTERY THERMAL STATE BASED ON VOLTAGE

STATEMENT REGARDING FEDERALLY SPONSORED RESEARCH OR DEVELOPMENT

The invention was made with Government support under Contract No. DTNH22-11-C-00214 awarded by the National Highway Traffic Safety Administration. The Government has certain rights to the invention.

TECHNICAL FIELD

This application is generally related to detecting when a rate of temperature increase of a battery exceeds a threshold during charging.

BACKGROUND

An electrified vehicle includes a traction battery. In a plug-in type of electrified vehicle, the traction battery may be coupled to charging equipment to charge the traction battery. The traction battery is normally configured to operate within a predetermined state of charge range. The upper limit of the predetermined state of charge range is normally at or below a rated charge capacity of the traction battery (e.g., less than 100% state of charge). However, there may be conditions in which a traction battery (or a subset of cells of the traction battery) is charged above the rated charge capacity. For example, current measurement errors may cause the state of charge to be underestimated. If the traction battery is overcharged for a certain period of time, the temperature of the traction battery may increase above a temperature limit. The over-temperature condition is further characterized by a rapid increase in temperature. A battery management system may be configured to monitor the thermal state of the traction battery to detect over-temperature conditions. Typical battery management systems monitor temperature sensors associated with the traction battery to detect a temperature of the traction battery that is above a predetermined temperature.

SUMMARY

A vehicle includes a traction battery and at least one controller. The at least one controller is programmed to, monitor a voltage of the traction battery during charging and, in response to the voltage decreasing at a rate greater than a predetermined rate signaling that the voltage is decreasing toward a local minimum that precedes an increase in the voltage indicative of a traction battery temperature increase rate becoming greater than a threshold, output a diagnostic signal.

The at least one controller may be further programmed to, in response to the diagnostic signal, open a contactor to disconnect the traction battery from a charge source. The at least one controller may be further programmed to, in response to the diagnostic signal, command a charge source to cease charging the traction battery.

The traction battery may be charged at a constant current. The voltage may be measured across terminals of the traction battery. The traction battery may include a plurality of cells and the voltage may be measured across one of the cells. The traction battery may include a plurality of cells arranged in a plurality of modules, and the voltage may be measured across one of the modules.

The vehicle may further include an alarm and the at least one controller may be further programmed to, in response to the diagnostic signal, activate the alarm to provide an alert.

A battery controller includes input channels configured to receive a voltage signal from a battery and output channels configured to provide diagnostic signals. The battery controller further includes control logic configured to, in response to the voltage signal decreasing during charging at a rate greater than a predetermined rate signaling that voltage is decreasing toward a local minimum that precedes an increase in voltage indicative of a battery temperature increase rate becoming greater than a threshold, generate a diagnostic signal.

The battery controller may further include a communication channel for communicating with a charge source and the control logic may be further configured to command the charge source to cease charging in response to the diagnostic signal. At least one of the output channels may be further configured to interface with a contactor and the control logic may be further configured to command the contactor to disconnect the battery from a charge source in response to the diagnostic signal. At least one of the output channels may be further configured to interface with a load coupled to the battery and the control logic may be further configured to command the load to draw current from a charge source in response to the diagnostic signal. At least one of the output channels may be further configured to interface with an alarm and the control logic may be further configured to command activation of the alarm in response to the diagnostic signal.

The voltage signal may be based on an overall pack voltage. The voltage signal may be based on a module voltage that includes a subset of cells that comprise the battery. The voltage signal may be based on a battery cell voltage.

A method of monitoring a battery includes monitoring, by at least one controller, a voltage of the battery during charging. The method further includes outputting, by the at least one controller, a diagnostic signal in response to the voltage decreasing at a rate greater than a predetermined rate signaling that the voltage is decreasing toward a local minimum that precedes an increase in the voltage indicative of a battery temperature increase rate becoming greater than a threshold.

The method may further include opening, by the at least one controller, a contactor to disconnect the battery from a charge source in response to the diagnostic signal. The method may further include commanding, by the at least one controller, a charge source to cease providing current for charging in response to the diagnostic signal. The method may further include commanding, by the at least one controller, a load coupled to the battery to draw current from a charge source in response to the diagnostic signal.

BRIEF DESCRIPTION OF THE DRAWINGS

FIG. 3 is a plot of a voltage of a battery as a function of state of charge that includes overcharging.

FIG. 4 is a flow chart of a possible set of operations for a battery monitoring system.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
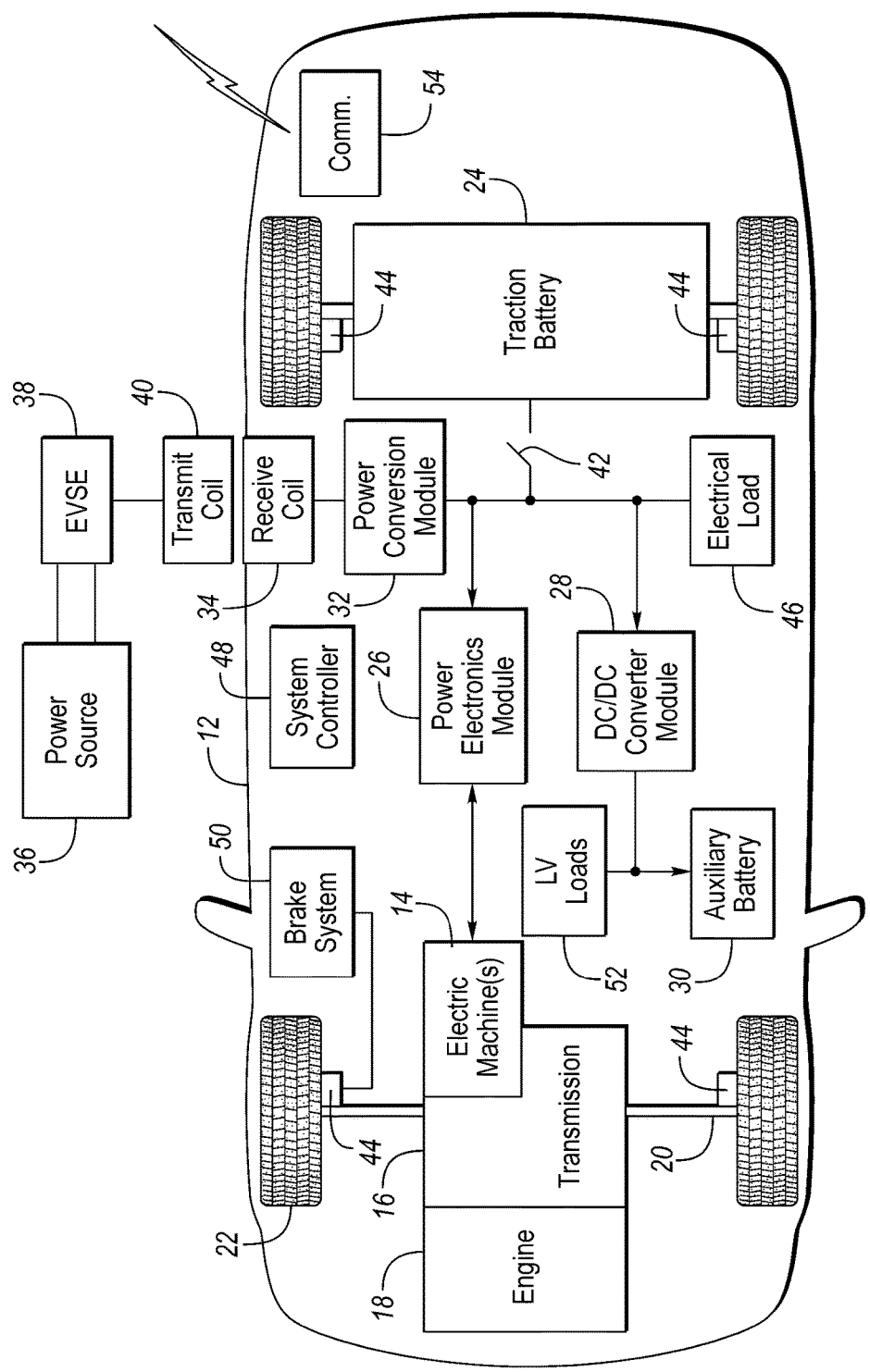
FIG. 1 is an example of an electrified vehicle.

FIG. 1 illustrates an electrified vehicle 12 that is depicted as a plug-in hybrid-electric vehicle (PHEV). A typical plug-in hybrid-electric vehicle 12 may comprise one or more electric machines 14 mechanically coupled to a hybrid transmission 16. The electric machines 14 may be capable of operating as a motor or a generator. In addition, the hybrid transmission 16 is mechanically coupled to an engine 18. The hybrid transmission 16 is also mechanically coupled to a drive shaft 20 that is mechanically coupled to the wheels 22. The electric machines 14 can provide propulsion and deceleration capability when the engine 18 is turned on or off. The electric machines 14 also act as generators and can provide fuel economy benefits by recovering energy that would normally be lost as heat in a friction braking system. The electric machines 14 may also reduce vehicle emissions by allowing the engine 18 to operate at more efficient speeds and allowing the hybrid-electric vehicle 12 to be operated in electric mode with the engine 18 off under certain conditions. An electrified vehicle 12 may include a battery electric vehicle (BEV) and a non-plug-in hybrid-electric vehicle (HEV). In a BEV configuration, the engine 18 may not be present.

A traction battery or battery pack 24 stores energy that can be used by the electric machines 14. A vehicle battery pack 24 typically provides a high voltage DC output. The traction battery 24 is electrically coupled to one or more power electronics modules. One or more contactors 42 may isolate the traction battery 24 from other components when opened and connect the traction battery 24 to other components when closed. The power electronics module 26 is also electrically coupled to the electric machines 14 and provides the ability to bi-directionally transfer energy between the traction battery 24 and the electric machines 14. For example, a traction battery 24 may provide a DC voltage while the electric machines 14 may operate with a three-phase AC current to function. The power electronics module 26 may convert the DC voltage to a three-phase AC current to operate the electric machines 14. In a regenerative mode, the power electronics module 26 may convert the three-phase AC current from the electric machines 14 acting as generators to the DC voltage compatible with the traction battery 24.

In addition to providing energy for propulsion, the traction battery 24 may provide energy for other vehicle electrical systems. A vehicle 12 may include a DC/DC converter module 28 that converts the high voltage DC output of the traction battery 24 to a low voltage DC supply that is compatible with low-voltage vehicle loads. An output of the DC/DC converter module 28 may be electrically coupled to an auxiliary battery 30 (e.g., 12V battery) for charging the auxiliary battery 30. The low-voltage systems may be electrically coupled to the auxiliary battery. Other high-voltage loads 46, such as compressors and electric heaters, may be coupled to the high-voltage output of the traction battery 24.

The electrified vehicle 12 that is a PHEV or a BEV may be configured to recharge the traction battery 24 from an external power source 36. The external power source 36 may be a connection to an electrical outlet. The external power source 36 may be electrically coupled to a charger or electric vehicle supply equipment (EVSE) 38. The external power source 36 may be an electrical power distribution network or grid as provided by an electric utility company. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically coupled to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically coupled or connected may transfer power using a wireless inductive coupling.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 50. The brake system 50 may include other components to operate the wheel brakes 44. For simplicity, the figure depicts a single connection between the brake system 50 and one of the wheel brakes 44. A connection between the brake system 50 and the other wheel brakes 44 is implied. The brake system 50 may include a controller to monitor and coordinate the brake system 50. The brake system 50 may monitor the brake components and control the wheel brakes 44 for vehicle deceleration. The brake system 50 may respond to driver commands and may also operate autonomously to implement features such as stability control. The controller of the brake system 50 may implement a method of applying a requested brake force when requested by another controller or sub-function.

One or more electrical loads 46 may be coupled to the high-voltage bus. The electrical loads 46 may have an associated controller that operates and controls the electrical loads 46 when appropriate. Examples of electrical loads 46 may be a fan, a heating element and/or an air-conditioning compressor.

Electronic modules in the vehicle 12 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 30. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 12. A vehicle system controller (VSC) 48 may be present to coordinate the operation of the various components.

The vehicle 12 may include a wireless communications module 54 to communicate with devices and systems remote from the vehicle 12. The wireless communications module 54 may include an onboard modem having an antenna to communicate with off-board devices or systems. The wireless communications module 54 may be a cellular communications device to enable communications via a cellular data network. The wireless communications module 54 may be a wireless local area network (LAN) device compatible with IEEE 802.11 family of standards (i.e., WiFi) or a WiMax network. The wireless communications module 54 may include a vehicle based wireless router to allow connection to remote networks in range of a local router. The wireless communications module 54 may interface with one or more controllers in the vehicle 12 to provide data.

The vehicle communication network may extend to the EVSE 38. The vehicle communication network may include conductors that are routed through the charge connector 40 and the charge port 34. In some configurations, a wireless communication protocol via the wireless communications module 54 may be implemented. The EVSE 38 may be configured to communicate with a grid management system 52 that controls and manages the power source 36. A communication system in which an electrified vehicle 12 communicates with a grid management system 52 may be referred to a Vehicle-to-Grid (V2G) communication system.

Figure 2:
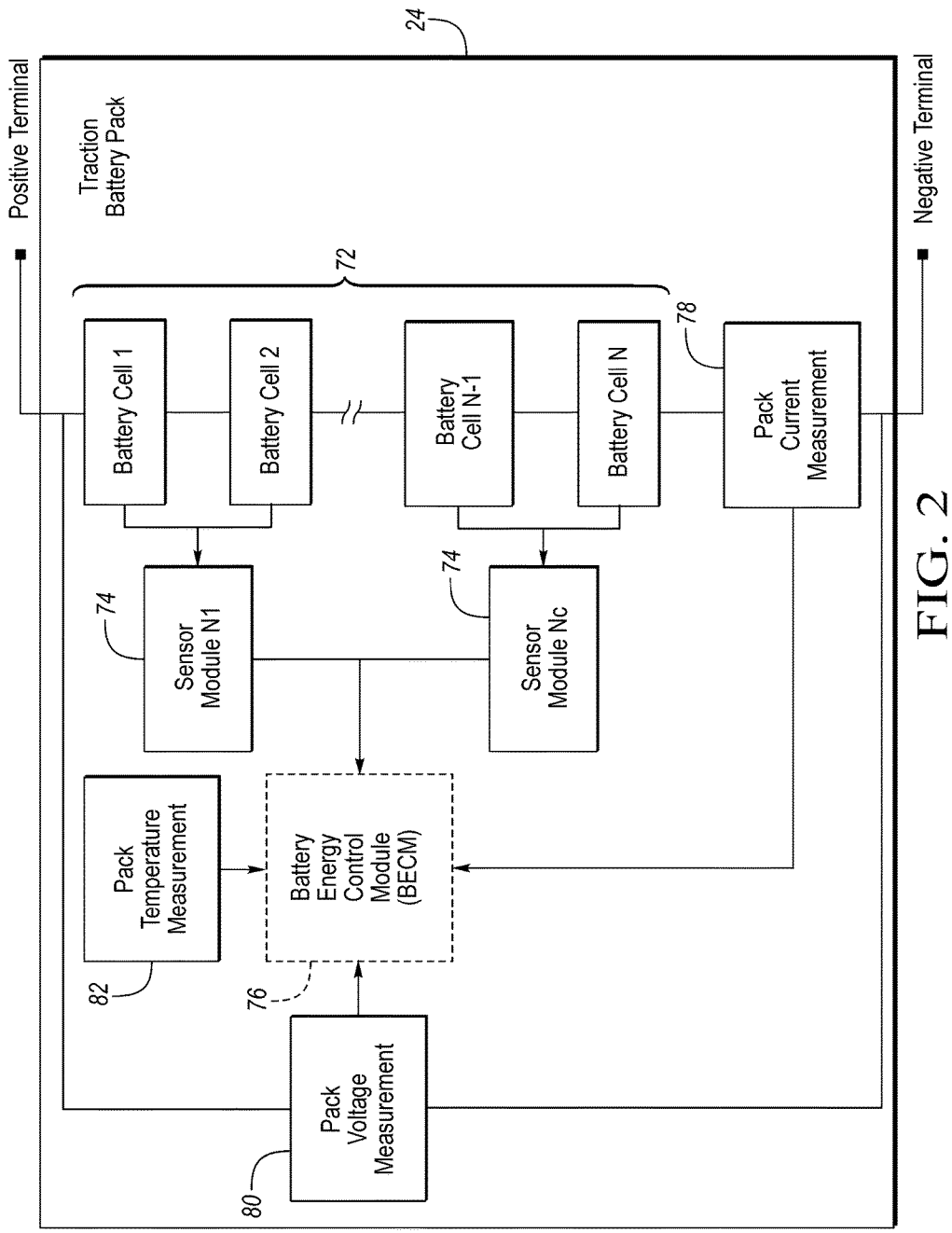
FIG. 2 is a possible configuration for a traction battery of the vehicle.

A traction battery 24 may be constructed from a variety of chemical formulations. Typical battery pack chemistries may be lead acid, nickel-metal hydride (NIMH) or Lithium-Ion. FIG. 2 shows a typical traction battery pack 24 in a simple series configuration of N battery cells 72. Other battery packs 24, however, may be composed of any number of individual battery cells connected in series or parallel or some combination thereof. A battery management system may have a one or more controllers, such as a Battery Energy Control Module (BECM) 76, that monitor and control the performance of the traction battery 24. The battery pack 24 may include sensors to measure various pack level characteristics. The battery pack 24 may include one or more pack current measurement sensors 78, pack voltage measurement sensors 80, and pack temperature measurement sensors 82. The BECM 76 may include circuitry to interface with the pack current sensors 78, the pack voltage sensors 80 and the pack temperature sensors 82. The BECM 76 may have non-volatile memory such that data may be retained when the BECM 76 is in an off condition. Retained data may be available upon the next key cycle.

In addition to the pack level characteristics, there may be battery cell 72 level characteristics that are measured and monitored. For example, the terminal voltage, current, and temperature of each cell 72 may be measured. A system may use a sensor module 74 to measure the battery cell 72 characteristics. Depending on the capabilities, the sensor module 74 may measure the characteristics of one or multiple of the battery cells 72. The battery pack 24 may utilize up to $N_c$ sensor modules 74 to measure the characteristics of all the battery cells 72. Each sensor module 74 may transfer the measurements to the BECM 76 for further processing and coordination. The sensor module 74 may transfer signals in analog or digital form to the BECM 76. In some configurations, the sensor module 74 functionality may be incorporated internally to the BECM 76. That is, the sensor module 74 hardware may be integrated as part of the circuitry in the BECM 76 and the BECM 76 may handle the processing of raw signals. The BECM 76 may also include circuitry to interface with the one or more contactors 42 to open and close the contactors 42.

It may be useful to calculate various characteristics of the battery pack. Quantities such as battery power capability and battery state of charge may be useful for controlling the operation of the battery pack as well as any electrical loads receiving power from the battery pack. Battery power capability is a measure of the maximum amount of power the battery can provide or the maximum amount of power that the battery can receive. Knowing the battery power capability allows the electrical loads to be managed such that the power requested is within limits that the battery can handle.

Battery pack state of charge (SOC) gives an indication of how much charge remains in the battery pack. The SOC may be expressed as a percentage of the total charge remaining in the battery pack. The battery pack SOC may be output to inform the driver of how much charge remains in the battery pack, similar to a fuel gauge. The battery pack SOC may also be used to control the operation of an electric or hybrid-electric vehicle. Calculation of battery pack SOC can be accomplished by a variety of methods. One possible method of calculating battery SOC is to perform an integration of the battery pack current over time. This is well-known in the art as ampere-hour integration.

The battery power capability may establish charge and discharge limits for the traction battery 24. The BECM 76 may compute a battery charge limit and a battery discharge limit periodically based on battery parameters and measurements. The battery charge limit may be zero when the traction battery 24 cannot be charged. When the traction battery 24 is fully charged, the battery charge limit may be zero. The traction battery 24 may be fully charged when the state of charge is greater than predetermined state of charge. The predetermined state of charge may be near a state of charge of one hundred percent.

The voltage of the battery cells may be described as a function of the state of charge of the associated cell. The relationship between the state of charge and the voltage is generally well understood in the nominal state of charge range (0 to 100%). The battery cells may be normally operated in the nominal state of charge range. The relationship is typically used to determine the state of charge after periods of rest when an open-circuit voltage of the battery is equivalent to the terminal voltage of the battery.

During normal conditions, the battery cells are not charged above a maximum state of charge such as one hundred percent. The state of charge of the battery cells may be monitored to ensure that none of the battery cells are charged above this maximum level. However, conditions may occur in which the state of charge of one or more battery cells is underestimated. For example, a system utilizing ampere-hour integration of the battery current may not report the proper state of charge in the presence of an offset to the current. A current offset may cause the measured current to appear less than the actual current and lead to an underestimation of the state of charge. Other internal battery issues such as internal short circuits may cause one or more battery cells to become charged to a higher level.

In some situations, the battery cells 72 may be imbalanced so that one or more battery cells 72 are at a higher state of charge than the other cells. In this situation, the high state of charge cells may be charged to a higher level than the other cells. The state of charge of some of the cells may be underestimated for a variety of reasons.

A battery management system may be configured to protect against overcharge conditions using a variety of methods. The battery management system may implement primary and secondary means of detecting overcharge conditions to provide maximum protection against such events. The battery management system may be configured to provide an alert when the battery thermal state is outside of predetermined thermal limits. The battery thermal state may include the temperature of the battery and a rate of temperature change of the battery.

During charging of the traction battery, a constant current may be supplied to the traction battery. In some configurations, a constant power may be supplied to the traction battery. The EVSE 38 and power conversion module 32 may cooperate to output a constant charge current to the traction battery 24. One or more controllers 76 may control a voltage output of the power conversion module 32 to adjust the voltage applied to the traction battery 24 to maintain a constant charging current. The traction battery 24 may have an associated resistance that varies as a function of state of charge and a temperature of the traction battery 24.

If the resistance of the traction battery 24 decreases, the voltage applied will be decreased to maintain the constant current charging. Similarly, if the resistance of the traction battery 24 increases, the voltage applied will be increased to maintain the constant current charging. When charging the traction battery 24 in the nominal state of charge range, the battery voltage may be expected to increase as the state of charge increases. The state of charge may be computed as an integral of the charging current over time. During constant current charging, the state of charge may increase at a constant rate. During constant current charging, the relationship of voltage to the state of charge may appear similar to the relationship of voltage to time.

A battery may normally be operated in a predetermined operating voltage range. As the battery is overcharged, it may experience a voltage increase and a temperature increase. The temperature of the battery may rise until thermal limits of the battery are exceeded. Approaching the thermal limits may be recognized by a rapid increase in voltage (e.g., greater than 1 volt/sec) and temperature (e.g., greater than 100° C./minute). The mechanism of the voltage and temperature rise relates to joule heating and the exothermic breakdown of battery components.

Typical battery management systems monitor the battery thermal state and provide an alert by monitoring one or more temperatures associated with the traction battery 24. If the temperature exceeds a particular temperature threshold, a diagnostic signal may be output. A disadvantage to this type of system is that a thermal condition in which battery thermal limits are exceeded is not recognized until the thermal limits have been exceeded. This allows little time to react to remedy the situation to mitigate the thermal condition. A system that recognizes the condition based on temperature may be unable to reverse the thermal condition.

At some time during overcharging of the battery, the voltage rises quickly as the charge conduction paths within the battery are compromised due to thermal and mechanical damage. Shortly before the rate of change of battery temperature increases above a threshold, a voltage dip is observed. The voltage dip may be characterized by a decrease in the voltage followed by an increase in the voltage. The voltage dip corresponds to a reduction in the resistance of the battery as certain battery components, such as the separator, begin to fail. This momentarily eases the path of current flow. By detecting this voltage dip, it may be possible to provide an earlier alert of an impending thermal condition.

FIG. 3 depicts an example plot depicting a battery cell voltage as a function of state of charge during an overcharge condition with constant current charging. The state of charge may be expressed on an x-axis 200 with a starting value of 100%. The voltage of the battery may be expressed on the y-axis 202. In a first range 204 of the overcharge, the voltage may increase at a relatively constant rate. In a second range 206, the rate of voltage increase may vary. For example, an initial rate increase may be observed followed by a decrease in the rate of increase. In a third range 208, the voltage may decrease at a relatively low rate. In a fourth range 210, the rate of voltage decrease may increase. The voltage may decrease to a local minimum 214. In a fifth range 212, the voltage may increase rapidly from the local minimum 214 which is indicative of the battery temperature increase rate approaching a threshold limit. The threshold limit may be an increase rate at which the thermal condition is irreversible. The battery management system may attempt to detect when the rapid voltage decay begins. Note that with constant current charging, the state of charge may be related to time by a fixed relationship such that plotting the voltage versus time would appear similar.

The precursor to the thermal condition may be characterized as a voltage dip. The voltage dip may be that portion of the voltage response about the local minimum 214. The thermal condition may be associated with the rapid voltage increase that follows the voltage dip. During this rapid voltage increase, the rate of temperature increase of the battery may be increasing. By detecting the condition during the rapid decay of the voltage, the system may have an opportunity to stop charging before the battery temperature increase rate becomes greater than the threshold limit.

By monitoring the voltage during an overcharge condition, it may be possible to predict when the battery temperature increase rate will exceed a predetermined threshold before the condition occurs. This may provide additional time to disconnect the EVSE 38 before the battery temperature exceeds a predetermined temperature limit. In this manner, a more serious thermal condition may be prevented by terminating the charge process.

The controller 76 may monitor the voltage of each of the battery cells 72. The rate of change of the voltage may be computed as the difference between consecutive voltage measurements divided by the time interval between the voltage measurements. A predetermined rate threshold may be defined for the detection of the voltage dip. For example, the voltage dip may be sensed when the rate of change of the voltage is less than the predetermined threshold. The predetermined threshold may be a negative value that indicates that the voltage is decreasing. In some configurations, the predetermined threshold may be 50 millivolts/second.

The controller 76 may include a plurality of input channels that are configured to receive voltage signals from the traction battery 24. The input channels may include scaling and filtering circuitry to provide the appropriate voltage to the controller inputs. The controller 76 may include control logic to monitor the voltage across a subset of the battery cells 72. For example, the traction battery may be comprised of a plurality of battery modules that include a plurality of battery cells connected in series. The voltage of each module may be monitored. Further, the rate of change of the module voltage may be computed and monitored to detect the impending thermal state. In addition, the overall voltage of the traction battery 24 may be monitored to detect the impending thermal state. The rate of change of the overall voltage may be monitored. The predetermined threshold may be different when using the cell voltage, module voltage or the overall voltage in the detection.

The controller 76 may include a plurality of output channels that are configured to provide diagnostic signals. The output channels may be discrete output signals. The output channels may be over the vehicle network. The controller 76 may include control logic to output a diagnostic signal in response to the voltage decreasing at a rate greater than a predetermined rate that signals that the voltage is decreasing toward the local minimum that precedes the increase in the voltage predictive of the impending battery temperature increase rate. The diagnostic signal may be stored in non-volatile memory of the controller 76. The vehicle 12 may include one or more alert or alarm devices. At least one of the output channels may be configured to interface with the alarm device. The alarm device may include an audible alarm such as a horn or speaker. The alarm device may include a visible alarm such as flashing headlights. The diagnostic signal may also trigger the alarm to notify the operator of the condition. In addition, the controller 76 may send the alarm via the wireless communications module 54. For example, the alarm may be received by a portable device carried by the operator.

In addition to notifying the operator, the controller 76 may perform additional actions to mitigate or prevent the impending thermal condition. At least one of the output channels may be configured to provide a signal to the power conversion module 32 to stop the flow of current to the traction battery 24. Signals may be sent to the EVSE 38 to stop the transfer of power to the vehicle 12. At least one of the output channels may be configured to interface with the high-voltage loads 46. The control logic may be configure to activated one or more of the high-voltage loads 46 in the vehicle to divert current from flowing to the traction battery 24. At least one of the output channels may be configured to interface with the contactors 42. The control logic may be configured to command the contactors 42 to disconnect the traction battery 24 from the high-voltage bus to prevent further charging of the traction battery 24.

FIG. 4 depicts a flow chart of a possible sequence of control logic operations to implement the thermal condition prediction. The operations may be implemented as a sequence of instructions in the controller (e.g., 76). At operation 300, the voltage is input to the detection logic. The voltage may be an overall pack voltage, a module voltage, and/or a battery cell voltage. At operation 302, the rate of change of the voltage may be computed. At operation 304, the rate of change of the voltage is compared to the threshold. If the rate of change is greater than or equal to the threshold, the logic may return to operation 300. If the rate of change is less than the threshold, operation 306 may be executed. At operation 306, a diagnostic signal may be output that indicates the impending thermal condition. At operation 308, actions may be taken to mitigate or prevent the thermal condition. For example, the alarm may be activated, contactors 42 may be opened, power supply components may be commanded to cease providing power to the traction battery 24, and/or other loads may be activated to divert current from flowing to the traction battery 24.

An advantage of the thermal condition detection is that the thermal condition may be detected before the battery temperature increase rate actually exceeds the threshold limit. The detection system may provide the alert several minutes before the condition which allows the operator to remedy the condition. For example, in response to receiving the thermal condition alert, the operator may disconnect the vehicle 12 from the EVSE 38. In some cases, the battery temperature increase rate may be kept below the threshold limit. In some cases, the rate of change of battery temperature may decrease or become negative (e.g., battery cooling). Another advantage of the detection system is that the detection relies on a rate of change of the voltage as opposed to absolute voltage levels. This allows detection of the condition in the presence of a significant voltage offset in the measured voltages. The detection system may further provide a backup to normal overcharge detection logic.

The thermal condition detection may be applicable to battery systems based on Lithium-ion chemistry. The thermal condition detection system may find application to vehicle-based traction batteries as described above. In addition, the system described is applicable to any battery system as may be used in a variety of non-automotive applications such as portable electronic systems or stationary power systems.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
A traction battery including a plurality of cells; and
a controller programmed to, monitor voltages of the cells during charging and, responsive to the cells being imbalanced and one of the voltages decreasing at a rate greater than a predetermined rate preceding a decrease toward a local minimum, the local minimum preceding a voltage increase indicative of a traction battery temperature increase rate becoming greater than a threshold, stop charging the traction battery.

2. The vehicle of claim 1 wherein the controller is further programmed to open a contactor to disconnect the traction battery from a charge source to stop charging.

3. The vehicle of claim 1 wherein the controller is further programmed to command a charge source to cease charging the traction battery to stop charging.

4. The vehicle of claim 1 wherein the traction battery is charged at a constant current.

5. The vehicle of claim 1 further comprising an alarm, wherein the controller is further programmed to, responsive to stopping charging of the traction battery, activate the alarm to provide an alert.

6. The vehicle of claim 1 wherein the cells are imbalanced when one or more of the cells are at a greater state of charge than other cells.

7. A battery controller comprising:
Input channels configured to receive a voltage signal from a battery;
Output channels configured to control battery charging; and
control logic configured to, in response to the voltage signal decreasing during charging at a rate greater than a predetermined rate preceding a decrease toward a local minimum, the local minimum preceding a voltage increase indicative of a battery temperature increase rate becoming greater than a threshold, stop charging the battery.

8. The battery controller of claim 7 further comprising a communication channel for communicating with a charge source, wherein the control logic is further configured to stop charging by commanding the charge source to cease providing power to the battery.

9. The battery controller of claim 7 wherein at least one of the output channels is further configured to interface with a contactor and the control logic is further configured to stop charging by commanding the contactor to disconnect the battery from a charge source.

10. The battery controller of claim 7 wherein at least one of the output channels is further configured to interface with a load coupled to the battery and the control logic is further configured to stop charging by commanding the load to draw current from a charge source.

11. The battery controller of claim 7 wherein the voltage signal is based on an overall pack voltage.

12. The battery controller of claim 7 wherein the voltage signal is based on a module voltage that includes a subset of cells that comprise the battery.

13. The battery controller of claim 7 wherein the voltage signal is based on a battery cell voltage.

14. The battery controller of claim 7 wherein at least one of the output channels is further configured to interface with an alarm and the control logic is further configured to command activation of the alarm in response to stopping charging.

15. A method of monitoring a battery comprising:
Monitoring, by a controller, a voltage of the battery during charging; and
outputting, by the controller, a diagnostic signal and terminating battery charging in response to the voltage decreasing at a rate greater than a predetermined rate preceding the voltage decreasing toward a local minimum, the local minimum preceding an increase in the voltage indicative of a battery temperature increase rate becoming greater than a threshold.

16. The method of claim 15 further comprising opening, by the controller, a contactor to disconnect the battery from a charge source in response to the diagnostic signal.

17. The method of claim 15 further comprising commanding, by the controller, a charge source to cease providing current for charging in response to the diagnostic signal.

18. The method of claim 15 further comprising commanding, by the controller, a load coupled to the battery to draw current from a charge source in response to the diagnostic signal.

* * * * *